United States Patent [19]

Hoshi et al.

[11] Patent Number: 4,702,371

[45] Date of Patent: Oct. 27, 1987

[54] CONTAINER FOR ELECTRICAL COMPONENTS

[75] Inventors: Akio Hoshi, Isesaki; Toshiyuki Oura, Ohme, both of Japan

[73] Assignees: Hitachi, Ltd.; Hitachi Tokyo Electronics Co., Ltd., both of Tokyo, Japan

[21] Appl. No.: 879,012

[22] Filed: Jun. 26, 1986

[30] Foreign Application Priority Data

Jul. 10, 1985 [JP] Japan .................................. 60-150129

[51] Int. Cl.[4] .......................... H05F 3/02; H05F 3/00
[52] U.S. Cl. .................... 206/328; 206/45.34; 206/334; 361/212; 361/220
[58] Field of Search .................. 206/328, 45.34, 334; 361/212, 220, 215, 222, 230

[56] References Cited

U.S. PATENT DOCUMENTS

| 4,327,832 | 5/1982 | de Matteo ................ 206/328 |
| 4,463,851 | 8/1984 | Cecil ...................... 206/328 |
| 4,485,531 | 12/1984 | Murphy .................. 206/328 |
| 4,494,651 | 1/1985 | Malcolm ................. 206/328 |
| 4,565,288 | 1/1986 | Walther ................... 206/328 |
| 4,590,534 | 5/1986 | Akamatsu et al. ....... 206/328 |
| 4,592,481 | 6/1986 | Chen ....................... 206/328 |
| 4,598,820 | 7/1986 | Murphy .................. 206/328 |

FOREIGN PATENT DOCUMENTS

| 12363 | 6/1979 | Japan . |
| 45280 | 5/1980 | Japan . |
| 125599 | 3/1982 | Japan . |
| 121898 | 7/1984 | Japan . |
| 1593760 | 7/1981 | United Kingdom . |

Primary Examiner—Joseph Man-Fu Moy
Attorney, Agent, or Firm—Antonelli, Terry & Wands

[57] ABSTRACT

A container for electrical components is formed of an elongated tube of a plastic material. A top wall of the tube consists of a lengthwise-extending transparent window, and electrically conductive portions sandwiching the transparent window. In order to prevent the electrostatic breakdown of the electrical components, which occurs when the electrical components contact the transparent window, the window is made thinner than the electrically conductive portions of the top wall of the tube so that the plane including the lower surface of the window and the plane including the lower surfaces of the conductive portions are spaced at a predetermined distance.

14 Claims, 10 Drawing Figures

FIG. 8
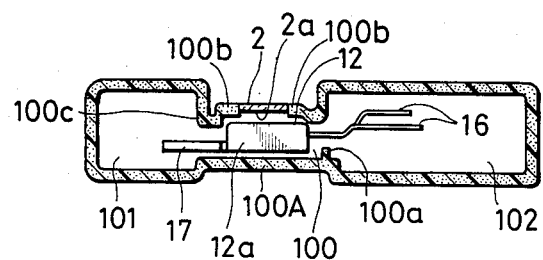
FIG. 9
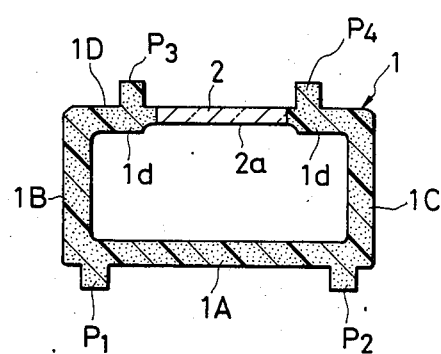
FIG. 10

CONTAINER FOR ELECTRICAL COMPONENTS

BACKGROUND OF THE INVENTION

This invention relates to a tubular container for storing a plurality of miniaturized electrical components, and, more particularly, to a container effectively utilized for storing, for example, semiconductor devices which are subject to electrostatic breakdown, especially, semiconductor integrated circuit devices or IC devices.

A structure formed tubularly so as to store a plurality of IC devices and having a window of a transparent plastic at a predetermined portion of an opaque conductive plastic body has been proposed as a magazine, i.e. a container for storing a plurality of IC devices. An example of this construction is proposed in, for example, U.S. Pat. No. 4,327,832 and U.S. Pat. No. 4,463,851. As apparent from the specifications of the above mentioned patents, the body of the structure is formed of an opaque conductive plastic to prevent the same from being electrically charged, and the IC devices stored therein from being electrostatically destroyed. The transparent window is provided so that the mark representing the product name of the IC devices can be easily identified from the outside.

However a disadvantage of the proposed IC devices resides in the fact that the IC devices contact the transparent window, not subjected to an antistatic treatment, and, consequently, the IC devices are electrostatically destroyed.

In U.S. Pat. No. 4,327,832 electrically conductive plastic internal projections or legs are provided integrally with a conductive plastic body on the portion thereof which is in the vicinity of a transparent window, so as to prevent the IC devices from contacting the transparent window. In U.S. Pat. No. 4,463,851 it is proposed to position a transparent window on the outer surface of the top wall of a tube, and provides a gap, which is capable of preventing the IC devices from contacting the transparent window, by utilizing the thickness of the top wall. These prior art containers have large overall dimensions and slightly large weights.

SUMMARY OF THE INVENTION

An object of the present invention is to provide a novel container having a light weight, a high mechanical strength and a simple construction, and designed so as to mechanically and electrically protect electrical components.

Another object of the present invention is to provide a novel container for mechanically and electrically protecting single-in-line type semiconductor integrated circuit devices.

In accordance with the present invention, the container for storing electrical components is formed of an elongated tube, and includes a top wall of an electrically conductive portion, and a transparent window, with the transparent window being formed to a thickness less than that of the electrically conductive portion so as to prevent the electrical components from contacting the inner surface of the transparent window.

BRIEF DESCRIPTION OF THE DRAWINGS

FIG. 8 is a sectional view of the container taken along the line Y—Y in FIG. 7;

FIG. 9 is a sectional view of a further embodiment of the container according to the present invention; and FIG. 10 is a perspective view of a semiconductor integrated circuit device to be stored in the container of FIG. 9.

DESCRIPTION OF THE PREFERRED EMBODIMENTS

Figure 1:
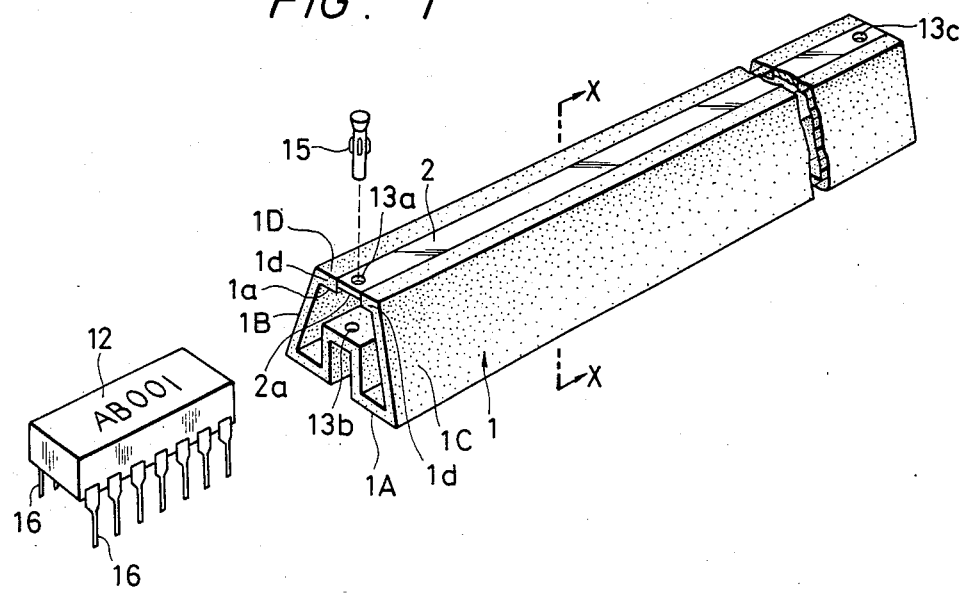
FIG. 1 is a perspective view of an embodiment of a container for electrical components according to the present invention.
Figure 2:
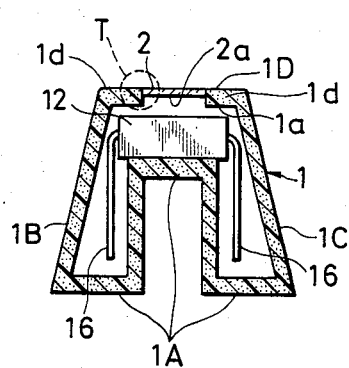
FIG. 2 is a sectional view of the container taken along the line X—X in FIG. 1.

Referring now to the drawings wherein like reference numerals are used throughout the various views to designate like parts and, more particularly, to FIGS. 1 and 2, according to these figures, the container is provided with a body generally designated by the reference numeral 1 formed integrally by using a plastic material in which the carbon is mixed as an antistatic agent. The body 1 is formed to a cross-sectionally inverted-U-shaped elongated tube so that a plurality of DIP (dual in-line package) type IC devices 12 as object articles, each of which has a plurality of leads 16 arranged in two parallel rows, can be stored therein. The tube includes a bottom wall 1A the substantially intermediate portion of which projects upward, side walls 1B, 1C extending diagonally upward from the bottom wall 1A, and a top wall 1D joined to the upper ends of the side walls 1B, 1C. The bottom wall 1A, side walls 1B, 1C and parts of the top wall 1D, which the IC device 12 contacts, include an electrically conductive plastic material, such as carbon-mixed polyvinyl chloride.

In the top wall of the tube 1, a transparent window 2, which includes a non-conductive transparent plastic, such as transparent polyvinyl chloride, is formed integrally with the conductive parts thereof. The window 2 is formed as a narrow strip and provided in a central portion of the top wall of the tube. Namely, the top wall 1D of the tube includes a transparent longitudinally extending window 2 positioned in the substantially central portion thereof, and electrically conductive portions 1d sandwiching the transparent window 2. The tube 1 is provided at both end portions thereof with bores 13, 13b, 13c, into which stopper pins 15 are inserted after IC devices 12 have been placed therein, so as to prevent the IC devices 12 from coming off. As shown in FIG. 2, the upper surfaces of the conductive portions 1d of the tube 1 and that of the transparent window 2 are flush with one another, and the thickness of the window 2 is smaller than that of the conductive portions 1d. Accordingly, the lower surface 2a of the transparent window 2 is higher than those 1a of the conductive portions 1d.

Figure 3:
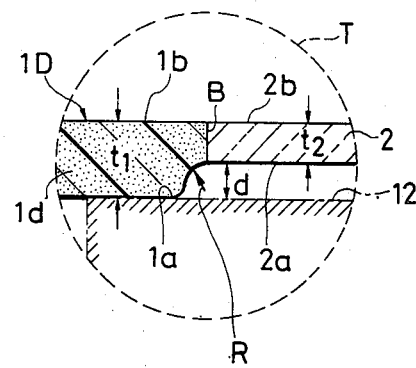
FIG. 3 is an enlarged fragmentary view of the container of FIG. 2.

Referring to FIG. 3, the top wall 1C has a flat upper surface. Namely, the upper surface 1b of a conductive portion 1d and that 2b of the transparent window 2 are flush with each other. The thickness $t_1$ of the conductive portion 1d is about 0.9 mm which is substantially equal to the thickness of the bottom wall 1A and side walls 1B, 1C. The thickness of the window 2 is about 0.6 mm. Accordingly, a distance d of about 0.3 mm is obtained between the plane including the lower surface 1a of the conductive portion 1d and that 2a of the plane including the window 2. Due to this distance d, an IC device (shown by a one-dot chain line) does not contact the lower surface 2a of the window 2 even when the IC device 12 is moved.

The thickness of the electrically conductive portion $t_1$ of, and that $t_2$ of the transparent window 2 in, a container suitably used for storing IC devices 12 are 1.0–0.7 mm and 0.6–0.4 mm, respectively.

As is clearly understood from a manufacturing method, more fully described hereinbelow, the transparent window 2 and electrically conductive portions 1d are formed unitarily of the same material, i.e. polyvinyl chloride, and the bonding strength of boundary portions B is very high. The part of the lower surface 1a of a conductive portion has a radius of curvature R of about 0.3 mm.

It is necessary that a part of an IC device 12 does not contact the lower surface of the transparent window when the IC device is inclined. According to the present invention, the container is designed with consideration given to the dimensions of the IC device 12, in such a manner that, even when the IC device 12 is inclined as shown by an arrow A in FIG. 4, it contacts not the lower surface 2a of the window but the wall portions of the contaner which have the electrical conductivity.

Figure 5:
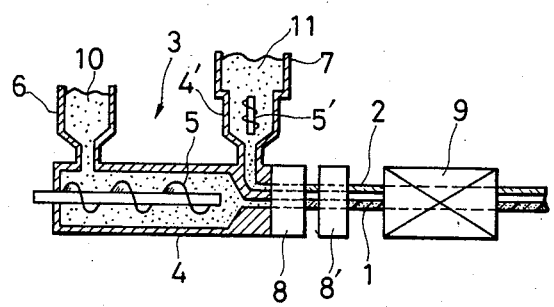
FIG. 5 is a longitudinal sectional view illustrating a method of manufacturing a container according to the present invention.

This container can be molded by a molding apparatus shown in FIG. 5, with an electrically conductive body 1 and a transparent window 2 formed unitarily at once. The molding apparatus 3 shown in FIG. 5 is provided with heating cylinders 4, 4', screws 5, 5', first and second hoppers 6, 7, a die 8 having a cross-sectional shape of the interior thereof which corresponds to that of the container, a die 8' for use in determining the final dimensions of the container, and a cooling element 9. The carbon powder and plastic powder 10 are introduced into the first hopper 6, and plastic powder into the second hopper 7. The plastic materials, softened in the heating cylinders 4, 4', are extruded continuously by the dies 8, 8' from the dies 8, 8' to be removed through the cooling element 9. As a result, a tube as a container in which a body 1 and a transparent window 2 are unitarily molded is obtained.

The quantity of the carbon powder introduced into the first hopper 6 is determined so that the resistivity of the electrically conductive portions of the molded container becomes not more than $1 \times 10^6 \, \Omega/\square$. As the plastic powder, polyvinyl chloride powder is selected. The plastic powder may consists of polystyrol instead of polyvinyl chloride. Since carbon is mixed in the electrically conductive body 1, this part assumes a black color.

As shown in FIG. 1, the DIL type IC device 12 is inserted into and removed from an end opening of the tube 1. The falling of the IC device 12 placed in the tube 1 is prevented by inserting the stopper pins 15 into the bores 13a, 13b, 13c made in both end portions of the tube.

The greater part of the tube 1 includes an antistatically-treated carbon-containing resin, i.e., having a conductivity, so that the electrostatic breakdown of the IC device 12 does not occur even when the IC device contacts the tube 1. However, the resin forming the transparent window 2 is transparent, i.e. includes a non-carbon-containing non-conductive resin, and is apt to be electrically charged. When the IC device 12 floatingly moves in the tube to contact the transparent window 2, an electrostatic breakdown of the IC device 12 would occur.

However, according to the present invention, the IC device 12 is prevented from contacting the transparent window 2, by the electrically conductive portions of the tube 1 even if the IC device 12 is floatingly moved in the tube. Therefore, the electrostatic breakdown of the IC device 12 can be prevented.

Figure 4:
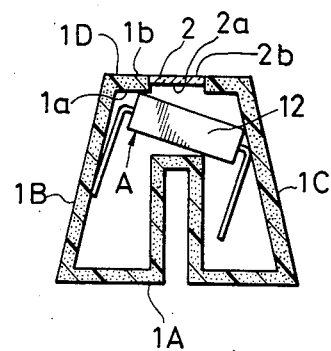
FIG. 4 is a sectional view of the container with an electrical component inclined therein.

Since the lower surface 2a of the transparent window 2 is higher than that 1a of the top wall of the tube 1 as shown in FIGS. 3 and 4, the moved IC device 12 necessarily contacts the lower surface of the top wall of the tube 1 first, and is prevented from contacting the window 2. Since the greater part of the tube 1 includes a carbon-containing resin, this part is not electrically charged, so that the electrostatic breakdown of the IC device 12 does not occur.

In the top wall of the tube 1, the upper surface of 2b of the transparent window 2 and upper surface 1b of the electrically conductive portions 1d are flush with one another. thereby enabling the container to be advantageously manufactured, and advantageously used as a container for IC devices 12.

Since the upper surface of the top wall of the tube 1 has no recesses and projections, the dies 8, 8' for forming the tube can be obtained at a low cost, and be subjected to little during the formation of the tube. Accordingly, the frequency in replacing the dies is low, so that the container can be manufactured at a low cost.

When a plurality of such containers (tubes) are transferred in a piled state, the upper containers can be stably maintained since the lower surfaces of the upper containers placed on the upper surfaces of the lower containers contact the same upper surfaces reliably without being inclined even if the mentioned lower surfaces are shifted slightly in the lateral direction.

Figure 6:
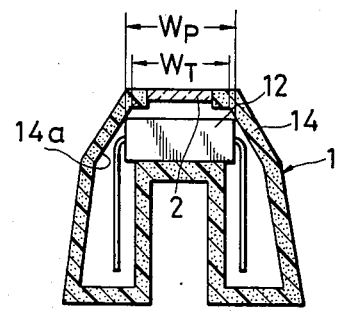
FIG. 6 is a sectional view of another embodiment of the container according to the present invention.

The embodiment of FIG. 6 is formed of an electrically conductive tube body 1 and a transparent window 2 in the manner similar to that in which the above described embodiment is formed and the materials used to manufacture the second embodiment are the same as those described hereinabove. The embodiment of FIG. 6 differs from the first described embodiment in that the parts of side walls of a tube 1, i.e. inclined wall portions 14 are formed so as to extend at a predetermined angle toward the positions close to the upper edge portions of an IC device 12 placed in the tube. Namely, the angle of the inclined wall portions 14 is determined so that the width $W_T$ of the inner surface of a top wall 1D of the tube 1 becomes smaller than that $W_P$ of a sealed body of the IC device 12.

Accordingly, in the embodiment of FIG. 6, the floatingly moved IC device 12 necessarily contacts the inner surface 14a of an inclined wall portion 14 first, so that the IC device 12 can be prevented more reliably from contacting the transparent window 2.

Figure 7:
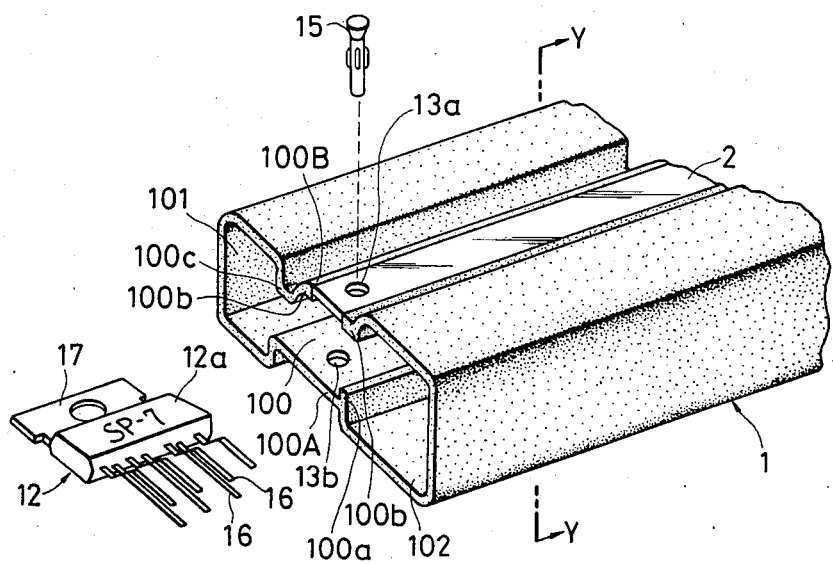
FIG. 7 is a perspective view of still another embodiment of the container according to the present invention.

FIG. 7 provides an example of a container for storing a SIL (single-in-line package) type IC device 12. More particularly, in FIG. 7, an IC device 12 to be inserted in a container includes a resin-sealed body 12a, a radiating member 17 extending from a side portion of the body 12a, and a plurality of leads 16 extending from the side portion of the body 12a which is on the opposite side of the side portion from which the radiating member 17 extends.

The container accommodating the IC device 12 is formed as an elongated tube 1 formed of polyvinyl chloride. The tube 1 includes a first housing portion 100 in which the resin-sealed body 12a of the IC device is held, a second housing portion 101 in which the radiating member 17 of the IC device is held, and a third housing portion in which the leads 16 of the IC device 12 are held. A bottom wall 100A of the first housing portion, and the second and third housing portions 101, 102 includes an electrically conductive plastic material, i.e. carbon-containing polyvinyl chloride. A top wall 100B of the first housing portion 100 is provided at the substantially central portion thereof with a transparent window 2, which includes a non-conductive transparent plastic, such as transparent polyvinyl chloride, in such a manner that a mark on the upper surface of the resin-sealed body 12a of the IC device 12 can be ascertained. The tube has electrically conductive portions 100b extending so as to sandwich the transparent window 2. The portions of the transparent window 2 and bottom wall 100A which are in an end portion of the tube 1 are provided with bores 13a, 13b, respectively, into which a stopper pin 15 is inserted after the IC device 12 has been inserted in the tube 1, so as to prevent the IC device 12 from being dislodged. In order to limit the lateral movement of the IC device 12 in the first housing portion 100, the bottom wall 100A and top wall 100B are provided with projections 100a, 100c, respectively.

As shown in FIG. 8, the upper surface of the top wall of the first housing portion 100 and that of the transparent window 2 are flush with each other, and the thickness of the transparent window 2 is smaller than that of the electrically conductive portions 100b. Accordingly, the lower surface 2a of the transparent window 2 is higher than those of the electrically conductive portions 100b. Namely, the construction of the parts of the transparent window 2 and electrically conductive portions 100b which are in the vicinity of the joint sections thereof is the same as that of the corresponding parts of the container shown in FIG. 3. The thickness of the carbon-mixed conductive portions (opaque portions) of the tube 1 in the embodiment of FIG. 7 is about 0.9 mm, with the conductive portions being formed to a constant thickness. The thickness of the transparent window is about 0.6 mm. Therefore, there is a distance of 0.3 mm between the plane including the lower surface of the transparent window 2 in and the plane including the electrically conductive portions 100b.

The container of the embodiment of FIG. 7 is made by using the molding apparatus 3 shown in FIG. 5, in the same manner as that described in hereinabove in connection with the embodiment of FIGS. 1–3. Accordingly, the opaque electrically conductive portions of the tube 1 and the transparent window therein are unitarily formed, so that these unitarily formed parts do not separate. As is clear from FIGS. 7 and 8, the container in has a cross-sectionally H-shaped construction. Namely, the thickness of the second and third housing portions, between which the first housing portion 100 is sandwiched, is larger than that of the first housing portion 100 so as to prevent the head portion and lower end portion of the stopper pin 15, which is inserted into the bores 13a, 13b, from projecting from the upper and lower main surfaces of the second and third portions 101, 102. This enables a plurality of containers to be piled up stably without being inclined. Since this container has a cross-sectionally H-shaped construction, it has a high mechanical strength.

A PLCC (plastic leaded chip carrier) type IC device has an external appearance shown in FIG. 10, and includes a resin-sealed body 12a, and a plurality of leads 16 molded in the shape of the letter "J" and extending outward from four side surfaces of the body 12a. A container for storing the IC device 12 is molded to an elongated tubular shape, which has a cross-sectional shape shown in FIG. 9. Namely, a tube 1 includes a bottom wall 1A, side walls 1B, 1C extending upward from the bottom wall 1A, and a top wall 1D joined to the upper ends of the side walls 1B, 1C. The bottom wall 1A, side walls 1B, 1C and parts of the top wall 1D, which the IC device shown in FIG. 10 contacts, includes an electrically conductive plastic material, such as carbon-mixed polyvinyl chloride. The top wall 1D of the tube includes a transparent window 2 positioned in the substantially central section thereof and composed of a non-conductive transparent plastic, such as transparent polyvinyl choride, and electrically conductive portions 1d. The upper surface of the top wall of and that of the transparent window 2 in the tube 1 are flush with each other, and the thickness of the window 2 is larger than that of the electrically conductive portions 1d of the tube 1. Accordingly, the lower surface 2a of the transparent window 2 is higher than those of the electrically conductive portions 1d. Namely, the portions of the tube 1 which are in the vicinity of the joint sections between the transparent window 2 and conductive portions 1d are constructed in the same manner as the corresponding portions of the tube of the embodiment of FIG. 10. The thickness of the carbon-mixed electrically conductive portions (opaque portions) of the tube 1 of Embodiment 4 is about 0.8 mm, and the thickness of the transparent window about 0.55 mm. Accordingly, there is a distance of about 0.25 mm between the plane including the lower surface of the window 2 in the top wall 1D and that including the lower surfaces of the conductive portions 1d thereof. Owe to this distance, the IC device 12 can be prevented from contacting the lower surface 2a of the transparent window 2 even if the IC device 12 is moved.

The bottom wall 1A is provided with a pair of projections $P_1$, $P_2$, and the top wall 1D a pair of projections $P_3$, $P_4$, as well. The distance between the projections $P_1$, $P_2$ is larger than that between the projections $P_3$, $P_4$. The reasons way the distances between these projections are set in this manner is that it is necessary to prevent the containers of the same construction, when they are stacked, from sliding sideways and collapsing.

The container of embodiment of FIG. 10 is formed by using the molding apparatus 3 shown in FIG. 5, in the same manner as the container described in the embodiment of FIGS. 1–3. Accordingly, the opaque conductive portions of and the transparent window in the window in the tube 1 are formed unitarily, so that these parts of the tube 1 do not separate.

The containers in the above described embodiments have the following effects.

Since the container body is formed so that a part thereof contacts the electrical components, such as IC devices 12 stored therein, the electrical components can be prevented from contacting the transparent window 2. This can prevent troubles, such as the electrostatic breakdown of the electrical components, which occurs if the electrical components contact the window 2 which is easily electrically charged.

Moreover, since the container body is molded tubularly with the conductive portions and transparent window 2 formed unitarily, the rigidity of the container body with respect to the twisting force and bending force increases thereby preventing the deformation of the container body.

Furthermore, since the container is molded out of a resin containing an antistatic agent (metal powder), such as carbon, it is not electrically charged.

Additionally, since the transparent window is provided, the interior of the container can be observed thereby enabling the marks on and the quantity of the electrical components stored in the container to be readily ascertained.

Moreover, the present invention has the following advantageous effects over a container such as disclosed in the above referenced U.S. Pat. No. 4,327,832.

According to the present invention, the tube is not provided on its inner surface with the special projections such as proposed in U.S. Pat. No. 4,327,832, and which are formed so as to present the electrical components from contacting the transparent window. Therefore, since the construction of the container according to the present invention is not complicated, the container can be formed to small dimensions and weight and at a low cost. This is a very important matter for the container as a transportation container after its basic problem of mechanically and electrically protecting electrical components. In the container disclosed in the above-noted United States patent it is considered possible that the projections wear or chip off due to the movements of the electrical components. Moreover, due to the provision of the projections on the inner surface of the tube and the necessity of leaving a spacial margin for the electrical components to be placed in the tube, the volume of the interior of the tube increases. This necessarily causes an increase in the dimensions of the container discosed in U.S. Pat. No. 4,327,832.

According to the present invention, the tube is formed so that the upper surfaces of the electrically conductive portions of the top wall and that of the transparent wall therein are flush with each other. Therefore, dust is not deposited on the transparent window, so that the electrical components stored in the tube can be observed very easily. According to the container disclosed in U.S. Pat. No. 4,327,832, there is a difference between the height of the upper surfaces of the electrically conductive portions of the top wall of the tube and that of the upper surface of the transparent window therein. This causes the deposition of dust to occur on the portions of the upper surface of the transparent window which are in the vicinity of the stepped portions, and the observation of the electrical components stored in the tube to be hampered. Moreover, it is considered possible that these stepped portions chip off.

According to the present invention, the joint sections between the electrically conductive portions and transparent window extend substantially flat, and do now have a complicated construction. This enables the dies in an injection molding machine for the production of this container to be constructed simply and obtained at a low cost. Consequently, the container can be manufactured at a low cost. According to the container disclosed in U.S. Pat. No. 4,327,832, the joint sections between the electrically conductive portions and transparent window are constructed in the shape of the letter "V", so that the steps of manufacturing a die for the production of this container become complicated.

Furthermore, the present invention has advantageous effects over a container such as proposed aforementioned in U.S. Pat. No. 4,463,851.

According to the present invention, the tube is formed simply with the thickness of the transparent window in the top wall thereof reduced. Therefore, the tube has small dimensions and light weight as previously mentioned. Since the tube is unitarily formed, it is not deformed, nor does the transparent window separate from the conductive portions. In the container proposed U.S. Pat. No. 4,463,851, a transparent window is pasted on the whole of the top wall of the conductive container body provided with a slit thereby causing the external dimensions and weight of the container to increase. Due to the pasted construction of the container, deformation thereof easily occurs. It is considered possible that the transparent window separate from the tube due to the force applied to the side walls thereof. Due to the pasted construction of the tube, it is difficult to mold the conductive body and transparent window unitarily and simultaneously.

While we have shown and described several embodiments in accordance with the present invention, it is understood that the same is not limited thereto but is susceptible to numerous changes and modifications such as, for example, the shapes and sizes of the conductive portions and transparent window may be suitably set in accordance with the those of the electrical components therefore, we do not intend to be limited to the details shown and described hereinabove but intend to cover all modifications as encompassed by the scope of the appended claims.

What is claimed is:

1. A one-piece extruded container for semi-conductor devices having a box-like shape resin encapsulation and a plurality of leads protruding from at least two side surfaces thereof and bending along a bottom surface of the devices, the container comprising an elongated tube formed of a plastic material so that a plurality of semi-conductor devices can be stored therein, said tube comprising a bottom wall, spaced side walls extending upwardly from said bottom wall, and a top wall joined to upper ends of said side walls, said bottom wall and said side walls being formed of an electrically conductive plastic material of a substantially equal thickness, said top wall including a longitudinally extending transparent window of plastic material integrally extruded with said side walls, an upper surface of said transparent window is flush with remaining portions of the top wall formed of the electrically conductive material, and electrically conductive portions sandwiching said transparent window and having a thickness substantially equal to the thickness of said bottom wall and said side walls, the thickness of said transparent window in said top wall being smaller than the thickness of said electrically conductive portions thereof so that a plane including a lower surface of said window and a plane including the lower surfaces of said conductive portions are spaced at a predetermined distance.

2. The container for electrical components according to claim 1, wherein said bottom wall, said side walls, and the electrically conductive portions of said top wall consist of conductive polyvinyl chloride, said transparent window in said top wall consisting of transparent polyvinyl chloride.

3. The container for electrical components according to claim 2, wherein said conductive polyvinyl chloride contains carbon.

4. The container for electrical components according to claim 1, wherein the upper surface of said transparent window in said top wall and that of said electrically conductive portions thereof are flush with one another.

5. The container for electrical components according to claim 1, wherein the thickness of said electrically conductive portions of said top wall is about 0.9 mm, the thickness of said transparent window therein being about 0.6 mm.

6. A controller according to claim 1, further comprising a pair of projections extending in a longitudinal direction of the upper and lower surface thereof.

7. The container for electrical components according to claim 1, wherein the portions of said transparent window in said top wall which are in the vicinity of both ends of said tube are provided with holes into which a stopper for preventing the falling of said electrical components is inserted.

8. A one-piece extruded container for storing electrical components each of which includes a resin-sealed body, a radiation member extending from said body, and a plurality of leads extending from said body in a direction opposite to the direction in which said radiating member extends, the container comprising an elongated tube of a plastic material, incuding a first housing portion for accommodating the resin-sealed body of said electrical component, a second housing portion for accommodating the radiating member of said electrical component, and a third housing portion for accommodating the leads of said electrical component, a bottom wall of said first housing portion, and said second and third housing portions including an electrically conductive plastic material, an integrally extruded top wall of said first housing portion including a transparent window of a plastic material positioned in the substantially central section thereof and extending in a longitudinal direction thereof, an upper surface of a top wall of said housing portion being flush with a top surface of said transparent window, and electrically conductive portions sandwiching said transparent window, a thickness of said transparent window in said top wall being smaller than a thickness of said electrically conductive portions thereof so that a plane including a lower surface of said transparent window and a plane including lower surfaces of said conductive portions are spaced at a predetermined distance.

9. The container according to claim 8, wherein a bottom wall of said first housing portion, electrically conductive sections of said top wall, and said second and third housing portions are formed of a conductive polyvinyl chloride, said transparent window in said top wall being formed of transparent polyvinyl chloride.

10. The container according to claim 9, wherein said conductive polyvinyl chloride contains carbon.

11. The container according to claim 8, wherein the upper surfaces of said window in and said electrically conductive portions of said top wall of said first housing portion are flush with one another.

12. The container according to claim 8, wherein the thickness of said electrically conductive portions of said top wall of said first housing portion is about 0.9 mm, the thickness of said transparent window therein being about 0.6 mm.

13. The container according to claim 8, wherein said electrical components stored in said tube are semiconductor devices.

14. The container according to claim 8, wherein the portions of said transparent window in said first housing portion which are in the vicinity of both ends of said tube are provided with holes into which a stopper for preventing the falling of said electrical components is inserted.

* * * * *